United States Patent
Jia et al.

(10) Patent No.: US 10,714,543 B2
(45) Date of Patent: Jul. 14, 2020

(54) OPTICAL FINGERPRINT IDENTIFICATION DEVICE AND DISPLAY PANEL

(71) Applicant: BOE TECHNOLOGY GROUP CO., LTD., Beijing (CN)

(72) Inventors: Yanan Jia, Beijing (CN); Xue Dong, Beijing (CN); Haisheng Wang, Beijing (CN); Chunwei Wu, Beijing (CN); Yingming Liu, Beijing (CN); Changfeng Li, Beijing (CN); Rui Xu, Beijing (CN); Lijun Zhao, Beijing (CN); Yunke Qin, Beijing (CN); Pinchao Gu, Beijing (CN); Yuzhen Guo, Beijing (CN); Yanling Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/316,541

(22) PCT Filed: Mar. 9, 2018

(86) PCT No.: PCT/CN2018/078580
§ 371 (c)(1),
(2) Date: Jan. 9, 2019

(87) PCT Pub. No.: WO2018/201800
PCT Pub. Date: Nov. 8, 2018

(65) Prior Publication Data
US 2019/0236327 A1    Aug. 1, 2019

(30) Foreign Application Priority Data

May 3, 2017    (CN) .......................... 2017 1 0305332

(51) Int. Cl.
*H01L 27/32* (2006.01)
*G06K 9/00* (2006.01)

(52) U.S. Cl.
CPC ........ *H01L 27/3227* (2013.01); *G06K 9/0004* (2013.01)

(58) Field of Classification Search
CPC .......... H01L 27/3225–3234; G06K 9/00–0012
See application file for complete search history.

(56) References Cited

U.S. PATENT DOCUMENTS 10,403,232 B2 *   9/2019  Zhou ..................... G06F 3/0421
2016/0132712 A1   5/2016  Yang et al.
(Continued)

FOREIGN PATENT DOCUMENTS

CN    102073860 A    5/2011
CN    103887328 A    6/2014
(Continued)

OTHER PUBLICATIONS

First Chinese Office Action dated May 28, 2019, received for corresponding Chinese Application No. 201710305332.4.
(Continued)

*Primary Examiner* — Patrick F Marinelli
(74) *Attorney, Agent, or Firm* — Kinney & Lange, P.A.

(57) ABSTRACT

Disclosed are an optical fingerprint identification device and a display panel including the same. The optical fingerprint identification device includes a light emitting structure and a photosensitive sensor. The light emitting structure includes a transparent first electrode, an opaque second electrode, an electroluminescent layer between the first electrode and the second electrode, and a through hole penetrating the first electrode, the electroluminescent layer and the second electrode. The photosensitive sensor is disposed on a side of the second electrode facing away from the electroluminescent
(Continued)

layer, and is configured to receive light rays transmitted through the through hole and acquire fingerprint information according to the received light rays.

20 Claims, 6 Drawing Sheets

(56) References Cited

U.S. PATENT DOCUMENTS

| | | | |
|---|---|---|---|
| 2017/0068041 A1 | 3/2017 | Lai et al. | |
| 2017/0075450 A1* | 3/2017 | Wang | G06F 3/044 |
| 2018/0211634 A1* | 7/2018 | Zhou | G01S 17/04 |
| 2018/0226016 A1* | 8/2018 | Suzuki | G09F 9/30 |
| 2018/0233113 A1* | 8/2018 | Zhou | G06F 1/3265 |
| 2018/0239942 A1* | 8/2018 | Xu | G06K 9/0004 |
| 2019/0050621 A1* | 2/2019 | Xu | G06F 21/32 |
| 2019/0156097 A1* | 5/2019 | Liu | G06K 9/0004 |
| 2019/0172886 A1* | 6/2019 | Ma | H01L 27/3258 |
| 2019/0179488 A1* | 6/2019 | Klenkler | G06F 3/0421 |
| 2019/0180073 A1* | 6/2019 | Zhang | G06F 3/0412 |
| 2019/0205600 A1* | 7/2019 | Kim | G06F 1/1643 |
| 2019/0236327 A1* | 8/2019 | Jia | G06K 9/0004 |
| 2019/0392190 A1* | 12/2019 | Chen | G06K 9/0004 |
| 2020/0020305 A1* | 1/2020 | Zhou | G06F 1/3265 |
| 2020/0042766 A1* | 2/2020 | Yang | G02F 1/133512 |
| 2020/0058726 A1* | 2/2020 | Ma | H01L 27/3225 |
| 2020/0065545 A1* | 2/2020 | Ahn | G06K 9/0004 |
| 2020/0066825 A1* | 2/2020 | Yang | H01L 27/3272 |

FOREIGN PATENT DOCUMENTS

| | | |
|---|---|---|
| CN | 105654075 A | 6/2016 |
| CN | 106056057 A | 10/2016 |
| CN | 106298859 A | 1/2017 |
| CN | 106462765 A | 2/2017 |
| CN | 107122750 A | 9/2017 |

OTHER PUBLICATIONS

International Search Report and English Translation of Box V of the Written Opinion dated May 30, 2018, received for corresponding PCT Application No. PCT/CN2018/078580.

* cited by examiner

OPTICAL FINGERPRINT IDENTIFICATION DEVICE AND DISPLAY PANEL

CROSS-REFERENCE TO RELATED APPLICATION

This application is a Section 371 National Stage Application of International Application No. PCT/CN2018/078580, filed on Mar. 9, 2018, entitled "OPTICAL FINGERPRINT IDENTIFICATION DEVICE AND DISPLAY PANEL," which claims priority to Chinese Application No. 201710305332.4, filed on May 3, 2017, incorporated herein by reference in their entirety.

TECHNICAL FIELD

Embodiments of the present disclosure relate to a field of optical fingerprint identification technology, and in particular to an optical fingerprint identification device and a display panel having the optical fingerprint identification device.

BACKGROUND

The term "fingerprint" refers to uneven lines on a front surface of a tip of a human finger. In these uneven lines, convex portions are called ridges and concave portions are called valleys. As the fingerprint is lifetime invariant, unique, and convenient, it has become almost synonymous with biometrics identification.

Currently, a fingerprint identification of a display module mainly includes a contact-type fingerprint identification, and a fingerprint identification device is generally disposed in a non-display area such as at a home key or on a back surface of the display module. Trends in display module development are moving toward ultra-thinness, broad color spectra, wide visual ranges, and component integration. Some recent research has consequently focused on integrating fingerprint identification devices into display areas of display modules so as to realize an optical fingerprint identification. However, in a process of the optical fingerprint identification, if a distance between a finger and a sensor is large, the sensor may simultaneously receive light reflected by a plurality of ridges and/or valleys due to scattering of light reflected by the finger. As a result, fingerprint information identified based on the light received by the sensor may not be accurate. The improvement of accuracy in the identification of fingerprint information in optical fingerprint identification has consequently become a problem to be solved for those skilled in the art.

SUMMARY

In one aspect, the present disclosure is directed to an optical fingerprint identification device. For example, the optical fingerprint identification device may include a light emitting structure and a photosensitive sensor. The light emitting structure includes a transparent first electrode, an opaque second electrode, an electroluminescent layer between the first electrode and the second electrode, and a through hole penetrating the first electrode, the electroluminescent layer and the second electrode. The photosensitive sensor is disposed on a side of the second electrode facing away from the electroluminescent layer, and is configured to receive light rays transmitted through the through hole and acquire fingerprint information according to the received light rays.

Optionally, the photosensitive sensor may include a photosensitive structure, a control structure and a current detecting structure. The photosensitive structure is configured for receiving the light rays transmitted through the through hole and generating an induced current according to the received light rays. The current detecting structure is configured for detecting the induced current generated by the photosensitive structure and acquiring the fingerprint information according to the induced current generated by the photosensitive structure. The control structure is configured for connecting the photosensitive structure with the current detecting structure so as to control connection or disconnection between the photosensitive structure and the current detecting structure.

Optionally, the photosensitive structure includes a photodiode.

Optionally, the photosensitive structure may include a transparent third electrode, a fourth electrode on a side of the third electrode facing away from the light emitting structure, and a photosensitive layer between the third electrode and the fourth electrode.

Optionally, projections of both the light emitting structure and the photosensitive structure in a direction perpendicular to a plane in which the electroluminescent layer is located coincide with each other.

Optionally, the optical fingerprint identification device further comprises a first insulation layer between the second electrode and the third electrode, and the first insulation layer is a transparent insulation layer.

Optionally, the control structure includes a thin film transistor.

Optionally, the control structure may include: an active layer, a second insulation layer covering the active layer, a gate metal layer on the second insulation layer, a third insulation layer covering the gate metal layer, an isolation layer covering the third insulation layer, a source/drain metal layer on the isolation layer, a passivation layer covering the source/drain metal layer, and a conductive electrode on the passivation layer. The source/drain metal layer includes a source electrode and a drain electrode; the gate metal layer includes a gate electrode; the source electrode and the drain electrode are in contact with the active layer through via holes penetrating the isolation layer, the third insulation layer and the second insulation layer; the conductive electrode is in contact with the source electrode through a via hole penetrating the passivation layer; and the conductive electrode is further in contact with the fourth electrode.

Optionally, the photosensitive structure and the control structure are both integrated on an array substrate of a display panel.

Optionally, a cross section of the through hole in a direction parallel to a plane in which the electroluminescent layer is located is circular, square or diamond.

Optionally, projections of the first electrode, the electroluminescent layer and the second electrode in a direction perpendicular to a plane in which the electroluminescent layer is located coincide with one another.

Optionally, an area of a projection of the through hole in the direction perpendicular to the plane in which the electroluminescent layer is located is less than an area of any one of the projections of the first electrode, the electroluminescent layer and the second electrode in the direction perpendicular to the plane in which the electroluminescent layer is located.

Optionally, the projection of the through hole in the direction perpendicular to the plane in which the electroluminescent layer is located is surrounded by any one of the projections of the first electrode, the electroluminescent layer and the second electrode in the direction perpendicular to the plane in which the electroluminescent layer is located.

In another aspect, the present disclosure is directed to a display panel.

Optionally, the display panel may include the optical fingerprint identification device according to any one as described above.

Optionally, the display panel is an organic light emitting display panel or a liquid crystal display panel.

Optionally, the optical fingerprint identification device is disposed in an active display area of the display panel.

Optionally, the optical fingerprint identification device is disposed in a frame area of the display panel.

In yet another aspect, the present disclosure is directed to a display panel including a display substrate and the optical fingerprint identification device as described above. The control structure of the optical fingerprint identification device is disposed on the display substrate, the photosensitive structure is disposed on a side of the control structure facing away from the display substrate, and the light emitting structure is disposed on a side of the photosensitive structure facing away from the display substrate.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION OF EMBODIMENTS

The technical solutions in the embodiments of the present disclosure will be clearly and completely described in conjunction with the drawings in the embodiments of the present disclosure. The affirmatively described embodiments constitute only a subset of the embodiments contemplated in view of the present disclosure, and not all of such embodiments. Further embodiments may be obtainable without any creative work or undue experimentation from the embodiments and description presented herein.

Figure 1:
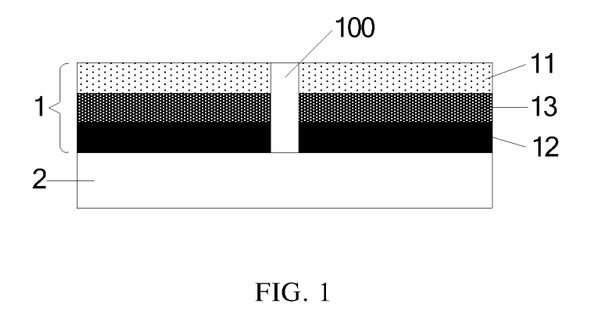
FIG. 1 is a schematic structural view of an optical fingerprint identification device according to an embodiment of the present disclosure.

According to an aspect of the present disclosure, an optical fingerprint identification device is provided. According to an exemplary embodiment, a schematic cross-sectional view of the optical fingerprint identification device is shown in FIG. 1, and a schematic top view of the optical fingerprint identification device is shown in FIG. 2. As shown in FIG. 1, the optical fingerprint identification device may include a light emitting structure 1 and a photosensitive sensor 2.

The light emitting structure 1 includes a first electrode 11, a second electrode 12, an electroluminescent layer 13 disposed between the first electrode 11 and the second electrode 12, and a through hole 100 penetrating the first electrode 11, the electroluminescent layer 13 and the second electrode 12. The first electrode 11 is a transparent electrode, and the second electrode 12 is an opaque electrode.

The photosensitive sensor 2 is disposed on a side of the light emitting structure adjacent to the second electrode, that is, on a side of the second electrode facing away from the electroluminescent layer, and is configured to receive light rays transmitted through the through hole 100 and acquire fingerprint information according to the received light rays.

It should be noted that, in the above embodiment, the first electrode 11 is disposed as a transparent electrode in order to enable detection light rays generated by the electroluminescent layer 13 to be transmitted. The second electrode 12 is disposed as an opaque electrode, on the one hand, in order to prevent the light rays generated by the electroluminescent layer 13 from directly irradiating onto the photosensitive sensor 2, and on the other hand, in order to prevent unwanted or undesirable detection light rays reflected by the finger from irradiating onto the photosensitive sensor 2.

Next, a the operation of the optical fingerprint identification device will be described with reference to the schematic view of FIG. 3.

Firstly, when fingerprint identification is required, voltages are applied to the first electrode 11 and the second electrode 12, such that the electroluminescent layer 13 is controlled to generate the detection light rays due to a voltage difference between the first electrode 11 and the second electrode 12.

Figure 3:
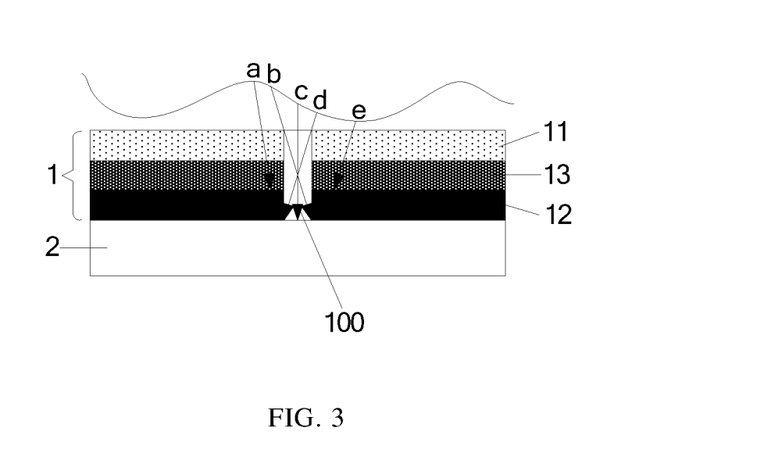
FIG. 3 is a cross-sectional view schematically illustrating the operation of the optical fingerprint identification device according to an embodiment of the present disclosure.

Secondly, the detection light rays emitted by the electroluminescent layer 13 are transmitted through the first electrode 11 and reach the finger (a curved line located above the optical fingerprint identification device in FIG. 3 indicates an outer contour of the finger), and the detection light rays are reflected by the finger to generate reflected light rays (as an example, in FIG. 3, the reflected light rays includes five light rays indicated by reference numerals a, b, c, d, e). Reflected light rays (light ray a, light ray e) have optical paths which are located in regions except the through hole 100, so that they sequentially pass through the first electrode 11 and the electroluminescent layer 13 to irradiate onto the second electrode 12. Since the second electrode 12 is an opaque electrode, the light ray a and the light ray e are blocked from being received by the photosensitive sensor 2. Reflected light rays (light ray b, light ray c, and light ray d) have optical paths which are located in regions where the through hole 100 is located, so that they pass through the first electrode 11, the electroluminescent layer 13, and the second electrode 12 by passing through the through hole 100 directly, so as to irradiate onto the photosensitive sensor 2. In this way, the reflected light rays whose optical paths are located in regions where the through hole 100 is located may be received by the photosensitive sensor 2. In other words, the reflected light rays received by the photosensitive sensor 2 are light rays that are reflected by a region between the light ray b and the light ray d and have a scattering angle between the light ray b and the light ray d. Since the light rays that can be received by the photosensitive sensor 2 are limited to the above region, it is ensured that the photosensitive sensor 2 receives information related to only one ridge or valley.

As shown in FIG. 1, an area of a projection of the through hole 100 in the direction perpendicular to the plane in which the electroluminescent layer is located is less than an area of any one of the projections of the first electrode 11, the electroluminescent layer 13 and the second electrode 12 in the direction perpendicular to the plane in which the electroluminescent layer is located. For example, the projection of the through hole 100 in the direction perpendicular to the plane in which the electroluminescent layer is located is surrounded by any one of the projections of the first electrode 11, the electroluminescent layer 13 and the second electrode 12 in the direction perpendicular to the plane in which the electroluminescent layer is located. In this way, the reflected light rays from a certain region of the finger and having a scattering angle within a certain range can be transmitted through the through hole 100 to be received by the photosensitive sensor 2.

As set forth with respect to FIG. 3, the light emitting structure of the optical fingerprint identification device presented herein has two effects. On the one hand, the light emitting structure is used to generate the detection light rays. On the other hand, the light emitting structure is used to filter the reflected light rays from the finger so that only the reflected light rays from a certain region of the finger and having a scattering angle within a certain range can be received by the photosensitive sensor.

In actual production, a thickness of the electroluminescent layer may be designed by considering the detection light rays generation by the electroluminescent layer 13 and the reflected light rays filtering by the electroluminescent layer 13 together.

Figure 2A:
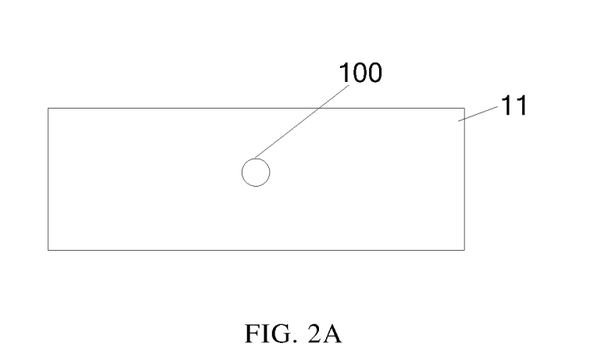
FIG. 2A, FIG. 2B and FIG. 2C are top views of a light emitting structure of an optical fingerprint identification device according to embodiments of the present disclosure.
Figure 2B:
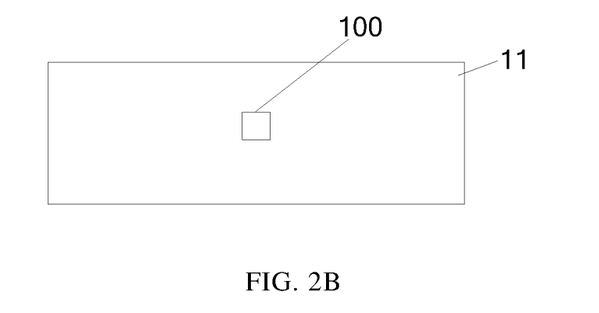
Figure 2C:
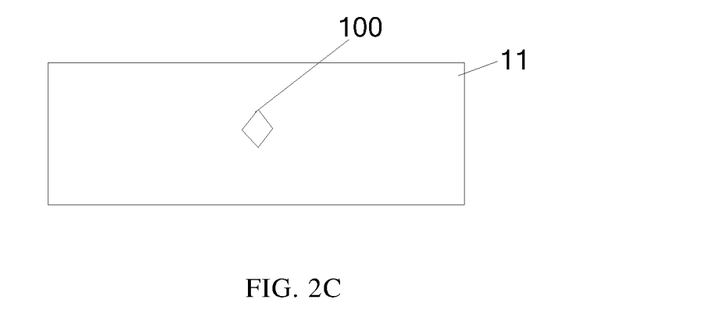

In addition, the shape of the through hole 100 is not limited in the embodiment of the present disclosure, and a radial cross section of the through hole 100 in the embodiment of the present disclosure may be circular or square or diamond or in other suitable shapes, as shown in FIGS. 2A-2C. It should be noted that, referring to FIG. 1, "the radial cross section of the through hole 100" may represent a cross section of the through hole 100 in a direction parallel to a plane in which the electroluminescent layer 13 is located.

The optical fingerprint identification device provided by the embodiment of the present disclosure includes a light emitting structure and a photosensitive sensor, as noted above. The light emitting structure includes the first electrode, the second electrode, and the electroluminescent layer disposed between the first electrode and the second electrode. With such a light emitting structure, the electroluminescent layer may generate the light rays for detecting the fingerprint by controlling the voltages applied to the first electrode and the second electrode. Optionally, as shown in FIG. 1, projections of the first electrode, the electroluminescent layer and the second electrode in the direction perpendicular to the plane in which the electroluminescent layer is located coincide with one another, so that it is advantageous for the electroluminescent layer to generate the light rays for detecting the fingerprint by controlling the voltages applied to the first electrode and the second electrode. The light emitting structure further includes the through hole penetrating the first electrode, the electroluminescent layer and the second electrode, the first electrode is a transparent electrode, and the second electrode is an opaque electrode, so that the light emitting structure may also filter the reflected light rays from the finger in such a way that only the reflected light rays that may pass through the through hole are received by the photosensitive sensor. As the reflected light rays that may pass through the through hole have the scattering angle within a certain range and are reflected by a certain region of the finger, the photosensitive sensor may only receive the light rays reflected from the region of the finger opposite to the photosensitive sensor, thereby preventing the photosensitive sensor from receiving simultaneously the light rays reflected by a plurality of ridges and/or valleys. Therefore, the optical fingerprint identification device provided by the embodiments of the present disclosure may improve the accuracy of the identified fingerprint information in the process of optical fingerprint identification.

Figure 4:
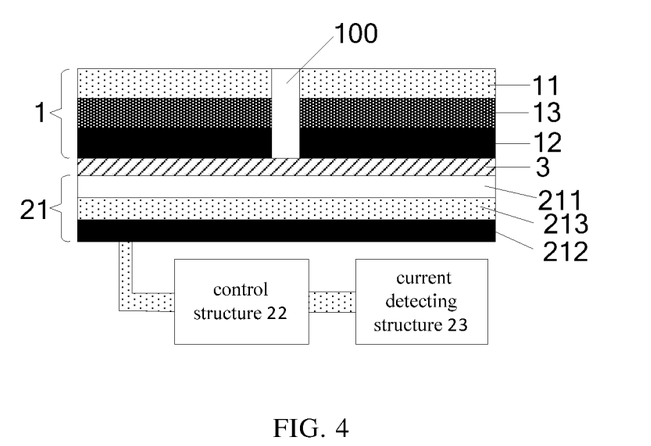
FIG. 4 is a schematic structural view of an optical fingerprint identification device according to an embodiment of the present disclosure, in which a photosensitive sensor of the optical fingerprint identification device is exemplarily shown.

In an exemplary embodiment, referring to FIG. 4, the photosensitive sensor 2 of the optical fingerprint identification device includes a photosensitive structure 21, a control structure 22, and a current detecting structure 23. The photosensitive structure 21 may include a third electrode 211, a fourth electrode 212, and a photosensitive layer 213 disposed between the third electrode 211 and the fourth electrode 212. The third electrode 211 is adjacent to the light emitting structure and is a transparent electrode. The fourth electrode 212 is disposed on a side of the third electrode 211 facing away from the light emitting structure 1. The photosensitive structure 21 is configured to receive the light rays transmitted through the through hole 100 and generate an induced current based on the received light rays.

The control structure 22 connects the photosensitive structure 21 and the current detecting structure 23 so as to control connection or disconnection between the photosensitive structure 21 and the current detecting structure 23.

In the case where the photosensitive structure 21 and the current detecting structure 23 are connected to each other (for example, electrical connection, wireless connection, etc.), the current detecting structure 23 detects the induced current generated by the photosensitive structure 21 and acquires fingerprint information according to the induced current generated by the photosensitive structure.

Since the light rays passing through the through hole 100 need to pass through the third electrode 211 to be received by the photosensitive layer 213, the third electrode 211 in the above embodiment must be formed of transparent material. In addition, since the photosensitive layer 213 is located above the fourth electrode 212, the embodiment of the present disclosure does not limit whether the fourth electrode 212 is transparent, that is, the fourth electrode 212 may be a transparent electrode or an opaque electrode.

In an exemplary embodiment, as shown in FIG. 4, projections of both the light emitting structure 1 and the photosensitive structure 21 in a direction perpendicular to a plane where the structure is located coincide with each other.

The optical fingerprint identification device further includes a first insulation layer 3. The first insulation layer 3 is located between the second electrode 12 and the third electrode 211, and the first insulation layer 3 is a transparent insulation layer.

Similarly, since the light rays passing through the through hole 100 need to pass through the first insulation layer 3 to be received by the photosensitive layer 213, the first insulation layer 3 in the above embodiment also needs to be formed of transparent material.

The projections of both the light emitting structure 1 and the photosensitive structure 21 in the direction perpendicular to the plane (e.g., plane in which the electroluminescent layer is located) where the structure is located coincide with each other, so that it is possible to reduce an area which is occupied by the light emitting structure 1 and the photosensitive structure 21 on the display panel, thereby increasing an aperture ratio of the display panel.

Figure 5:
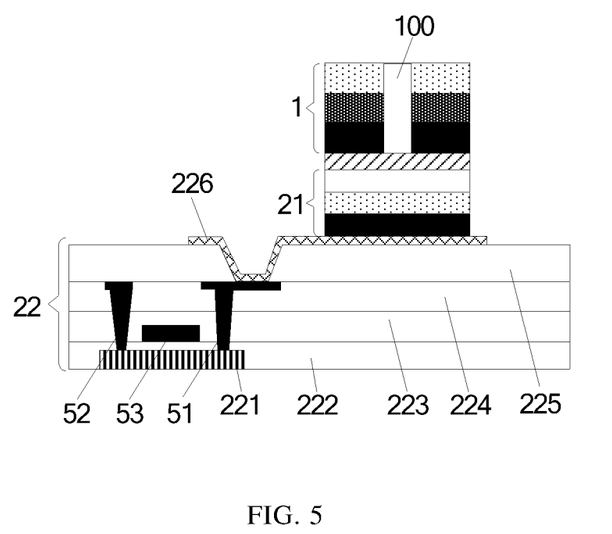
FIG. 5 is a schematic structural view of an optical fingerprint identification device according to an embodiment of the present disclosure, in which a control structure of the optical fingerprint identification device is exemplarily shown.

According to an exemplary embodiment, as shown in FIG. 5, the control structure 22 may include an active layer 221, a second insulation layer 222 covering the active layer 221, a gate metal layer disposed on the second insulation layer, a third insulation layer 223 covering the gate metal layer, an isolation layer 224 covering the third insulation layer 223, a source/drain metal layer disposed on the isolation layer, a passivation layer 225 covering the source/drain metal layer, and a conductive electrode 226 on the passivation layer.

The source/drain metal layer includes a source electrode 51, a drain electrode 52, and a data line. The gate metal layer includes a gate electrode 53 and a gate line in contact with the gate electrode 51. The source electrode 51 and the drain electrode 52 are in contact with the active layer 221 through via holes penetrating the isolation layer 224, the third insulation layer 223 and the second insulation layer 222. The data line is in contact with the drain electrode 52. The conductive electrode 226 is in contact with the source electrode 51 through a via hole penetrating the passivation layer. The conductive electrode 226 is also in contact with the fourth electrode 212.

Figure 6:
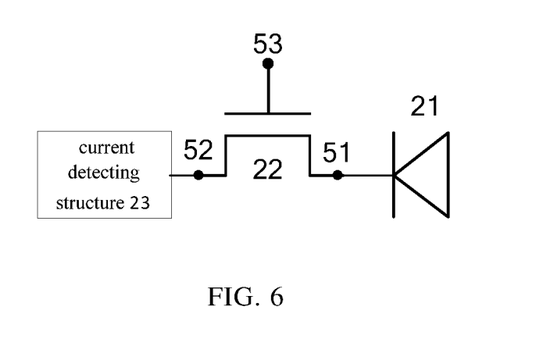
FIG. 6 is an equivalent circuit diagram of a photosensitive sensor according to an embodiment of the present disclosure.

It can be known from FIG. 4 and FIG. 5 that the photosensitive structure 21 and the control structure 22 of the photosensitive sensor 2 in the embodiment of the present disclosure may be a photodiode and a thin film transistor integrated in the display panel, respectively. An equivalent circuit diagram of the structure formed by the photosensitive structure 21 and the control structure 22 is shown in FIG. 6, in which a cathode of the photodiode is connected to the source electrode 51 of the thin film transistor 22, and the drain electrode of the thin film transistor 22 is connected to the current detecting structure 23 through the data line.

Figure 7:
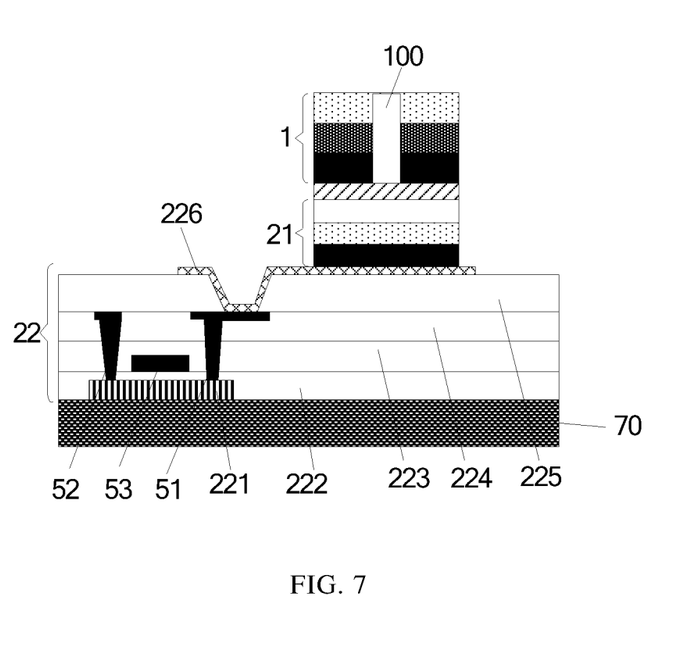
FIG. 7 is a schematic structural view of an optical fingerprint identification device according to an embodiment of the present disclosure.

In a further exemplary embodiment, referring to FIG. 7, the photosensitive structure 21 and the control structure 22 are both integrated or disposed on an array substrate 70 of the display panel. In the embodiment, the optical fingerprint identification device may be integrated into the display panel by integrating or disposing the photosensitive structure 21 and the control structure 22 on the array substrate 70 of the display panel, thereby saving manufacturing cost of the optical fingerprint identification device while enabling the display panel to have optical fingerprint identification function.

According to another aspect of the present disclosure, there is also provided a display panel including the optical fingerprint identification device provided by any of the above embodiments.

According to various embodiments, the display panel may specifically be any display panel of any product or component having display function, such as an electronic paper, a mobile phone, a tablet computer, a television, a display, a notebook computer, a digital photo frame, a navigator, and the like.

In an exemplary embodiment, the display panel may be an organic light emitting display panel (OLED) or a liquid crystal display panel (LCD).

Figure 8A:
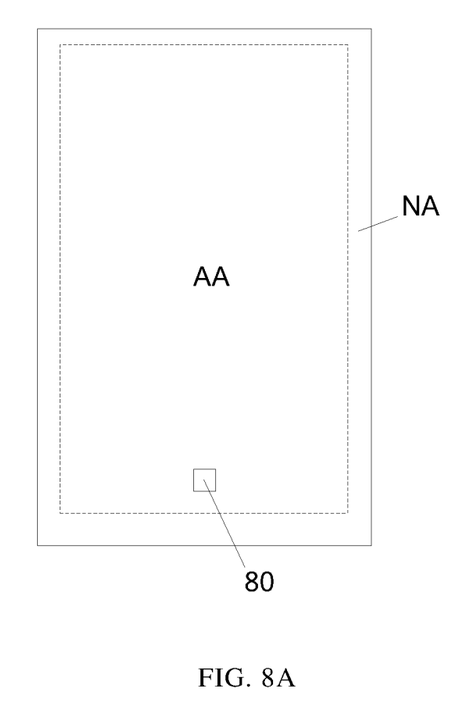
FIG. 8A and FIG. 8B are top views of a display panel including an optical fingerprint identification device according to an embodiment of the present disclosure.

In an exemplary embodiment, the optical fingerprint identification device is disposed within an active display area (AA) of the display panel. As shown in FIG. 8A, the optical fingerprint identification device 80 is disposed within the active display area AA of the display panel.

Figure 8B:
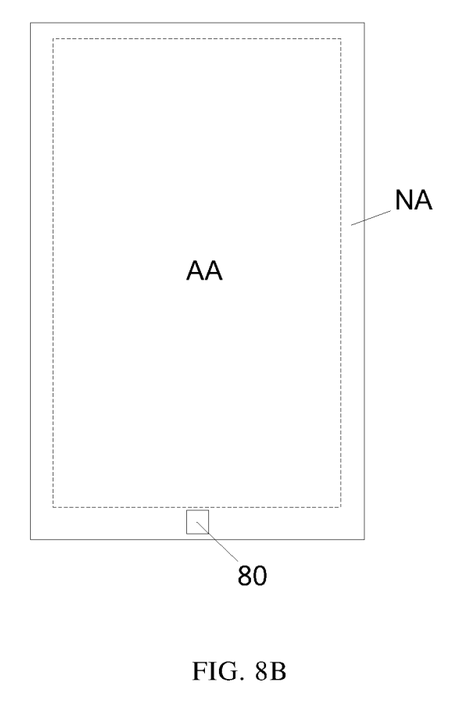

In an exemplary embodiment, the optical fingerprint identification device is disposed within a frame area of the display panel. As shown in FIG. 8B, the optical fingerprint identification device 80 is disposed within a frame area NA of the display panel.

The exemplary embodiments described above constitute only some of the embodiments contemplated in view of the present disclosure, and the scope of the present disclosure is not limited thereto. Changes or substitutions which are made by those skilled in the art without departing from the spirit and essence of the present disclosure are intended to fall within the scope of the present disclosure.

What is claimed is:

1. An optical fingerprint identification device comprising:
   a light emitting structure comprising:
      a transparent first electrode;
      an opaque second electrode;
      an electroluminescent layer situated between the first electrode and the second electrode; and
      a through hole penetrating the first electrode, the electroluminescent layer and the second electrode; and
   a photosensitive sensor on a side of the second electrode facing away from the electroluminescent layer, the photosensitive sensor being configured to receive light rays transmitted through the through hole and acquire fingerprint information according to the received light rays.

2. The optical fingerprint identification device according to claim 1, wherein the photosensitive sensor comprises:
   a photosensitive structure for receiving the light rays transmitted through the through hole and generating an induced current according to the received light rays;
   a current detecting structure for detecting the induced current generated by the photosensitive structure and acquiring the fingerprint information according to the induced current generated by the photosensitive structure; and
   a control structure, the control structure connecting the photosensitive structure with the current detecting structure so as to control connection or disconnection between the photosensitive structure and the current detecting structure.

3. The optical fingerprint identification device according to claim 2, wherein the photosensitive structure comprises a photodiode.

4. The optical fingerprint identification device according to claim 3, wherein the photosensitive structure comprises:
   a transparent third electrode;
   a fourth electrode on a side of the third electrode facing away from the light emitting structure; and
   a photosensitive layer between the third electrode and the fourth electrode.

5. The optical fingerprint identification device according to claim 4, wherein the optical fingerprint identification device further comprises a first insulation layer between the second electrode and the third electrode, and the first insulation layer is a transparent insulation layer.

6. The optical fingerprint identification device according to claim 2, wherein the control structure comprises a thin film transistor.

7. The optical fingerprint identification device according to claim 6, wherein the control structure comprises: an active layer, a second insulation layer covering the active layer, a gate metal layer on the second insulation layer, a third insulation layer covering the gate metal layer, an isolation layer covering the third insulation layer, a source/drain metal layer on the isolation layer, a passivation layer covering the source/drain metal layer, and a conductive electrode on the passivation layer;
- the source/drain metal layer comprises a source electrode and a drain electrode;
- the gate metal layer comprises a gate electrode;
- the source electrode and the drain electrode are in contact with the active layer through via holes penetrating the isolation layer, the third insulation layer and the second insulation layer;
- the conductive electrode is in contact with the source electrode through a via hole penetrating the passivation layer; and
- the conductive electrode is further in contact with the fourth electrode.

8. The optical fingerprint identification device according to claim 7, wherein the photosensitive structure and the control structure are both integrated on an array substrate of a display panel.

9. A display panel comprising:
- a display substrate; and
- the optical fingerprint identification device according to claim 2,
- wherein the control structure of the optical fingerprint identification device is disposed on the display substrate, the photosensitive structure is disposed on a side of the control structure facing away from the display substrate, and the light emitting structure is disposed on a side of the photosensitive structure facing away from the display substrate.

10. The display panel according to claim 9, wherein projections of both the light emitting structure and the photosensitive structure on the display substrate in a direction perpendicular to a plane in which the electroluminescent layer is located coincide with each other.

11. The display panel according to claim 9, wherein the optical fingerprint identification device is disposed in an active display area or a frame area of the display panel.

12. The optical fingerprint identification device according to claim 2, wherein projections of both the light emitting structure and the photosensitive structure in a direction perpendicular to a plane in which the electroluminescent layer is located coincide with each other.

13. The optical fingerprint identification device according to claim 1, wherein a cross section of the through hole in a direction parallel to a plane in which the electroluminescent layer is located is circular, square or diamond.

14. A display panel comprising the optical fingerprint identification device according to claim 1.

15. The display panel according to claim 14, wherein the display panel is an organic light emitting display panel or a liquid crystal display panel.

16. The display panel according to claim 14, wherein the optical fingerprint identification device is disposed in an active display area of the display panel.

17. The display panel according to claim 14, wherein the optical fingerprint identification device is disposed in a frame area of the display panel.

18. The optical fingerprint identification device according to claim 1, wherein projections of the first electrode, the electroluminescent layer and the second electrode in a direction perpendicular to a plane in which the electroluminescent layer is located coincide with one another.

19. The optical fingerprint identification device according to claim 18, wherein an area of a projection of the through hole in the direction perpendicular to the plane in which the electroluminescent layer is located is less than an area of any one of the projections of the first electrode, the electroluminescent layer and the second electrode in the direction perpendicular to the plane in which the electroluminescent layer is located.

20. The optical fingerprint identification device according to claim 19, wherein the projection of the through hole in the direction perpendicular to the plane in which the electroluminescent layer is located is surrounded by any one of the projections of the first electrode, the electroluminescent layer and the second electrode in the direction perpendicular to the plane in which the electroluminescent layer is located.

* * * * *